United States Patent
Wang et al.

(10) Patent No.: US 10,114,434 B2
(45) Date of Patent: Oct. 30, 2018

(54) HEAT DISSIPATION MODULE AND ELECTRONIC DEVICE

(71) Applicant: Acer Incorporated, New Taipei (TW)

(72) Inventors: Yung-Chih Wang, New Taipei (TW); Wen-Neng Liao, New Taipei (TW); Cheng-Wen Hsieh, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 15/345,051

(22) Filed: Nov. 7, 2016

(65) Prior Publication Data

US 2017/0220084 A1   Aug. 3, 2017

(30) Foreign Application Priority Data

Feb. 2, 2016   (TW) .............................. 105103327 A

(51) Int. Cl.
*H05K 7/20* (2006.01)
*G06F 1/20* (2006.01)
(Continued)

(52) U.S. Cl.
CPC .......... *G06F 1/206* (2013.01); *F28D 15/043* (2013.01); *F28D 15/046* (2013.01); *F28D 15/06* (2013.01);
(Continued)

(58) Field of Classification Search
CPC . G06F 1/181–1/182; H05K 7/20218–7/20381;
(Continued)

(56) References Cited

U.S. PATENT DOCUMENTS 5,841,244 A * 11/1998 Hamilton ................ F28D 15/04
                                                                315/248
6,531,866 B2 * 3/2003 Miyata ................ G01D 5/2086
                                                                324/207.12
(Continued)

FOREIGN PATENT DOCUMENTS

CN        2772025        4/2006
CN        1885530        12/2006
(Continued)

*Primary Examiner* — Anthony Haughton
*Assistant Examiner* — Razmeen Gafur
(74) *Attorney, Agent, or Firm* — J.C. Patents

(57) ABSTRACT

A heat dissipation module being disposed in an electronic device is provided. The electronic device has a heat source. The heat dissipation module includes an evaporator, a pipe, a magnetic field generator and a plurality of magnetic powder. The heat source is heat conducting to the evaporator. The pipe is connected to the evaporator to form a loop therewith, and a working fluid is filled in the loop. The magnetic field generator is disposed outside of the evaporator. The magnetic powder is movably disposed in the evaporator. A magnetic field generated by the magnetic field generator drives the magnetic powder to form a channel in the evaporator where the working fluid passes through. The heat generated by the heat source is transmitted to the evaporator, and the working fluid in liquid phase absorbs the heat and is phase-transited to vapor phase and flows from the evaporator towards the pipe.

13 Claims, 7 Drawing Sheets

(51) Int. Cl.
*F28F 27/00* (2006.01)
*F28D 15/04* (2006.01)
*F28D 15/06* (2006.01)
*H01L 23/473* (2006.01)

(52) U.S. Cl.
CPC ......... *F28F 27/00* (2013.01); *H05K 7/20309* (2013.01); *H05K 7/20327* (2013.01); *H05K 7/20381* (2013.01); *H05K 7/20436* (2013.01)

(58) Field of Classification Search
CPC ............ H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 6,813,114 | B2* | 11/2004 | Taga | G11B 5/102 360/99.01 |
| 2003/0042009 | A1* | 3/2003 | Phillips | F28D 15/043 165/104.26 |
| 2003/0209842 | A1* | 11/2003 | Okumura | C22C 1/0441 266/249 |
| 2004/0012983 | A1* | 1/2004 | Fearing | H02M 7/003 363/16 |
| 2005/0111183 | A1* | 5/2005 | Pokharna | G06F 1/203 361/679.48 |
| 2005/0205241 | A1* | 9/2005 | Goodson | F04B 19/006 165/80.4 |
| 2007/0242438 | A1* | 10/2007 | Belits | F28D 15/0266 361/700 |
| 2008/0089029 | A1* | 4/2008 | Launay | G06F 1/203 361/697 |
| 2008/0164010 | A1* | 7/2008 | Kang | F28D 15/0266 165/104.26 |
| 2008/0253082 | A1* | 10/2008 | Lev | G06F 1/203 361/679.46 |
| 2008/0259557 | A1* | 10/2008 | Lev | G06F 1/203 361/679.52 |
| 2009/0073542 | A1* | 3/2009 | Majima | B41M 5/36 359/296 |
| 2010/0018677 | A1* | 1/2010 | Leng | F28D 15/025 165/104.26 |
| 2010/0091450 | A1* | 4/2010 | Hung | G06F 1/1616 361/679.52 |
| 2012/0014068 | A1* | 1/2012 | Nakanishi | H01L 23/10 361/717 |
| 2013/0114204 | A1* | 5/2013 | Nigen | G06F 1/203 361/679.48 |
| 2013/0308272 | A1* | 11/2013 | Furuta | F28D 15/02 361/700 |
| 2015/0009004 | A1* | 1/2015 | Zhou | H01F 27/2847 336/208 |
| 2015/0124402 | A1* | 5/2015 | Jang | B32B 27/08 361/679.55 |
| 2015/0346775 | A1* | 12/2015 | Tseng | G06F 1/16 361/679.27 |
| 2015/0353661 | A1* | 12/2015 | Fukagawa | C08F 20/18 359/296 |
| 2016/0120019 | A1* | 4/2016 | Shedd | H05K 1/0204 361/679.47 |
| 2016/0157334 | A1* | 6/2016 | Koukami | H01L 23/3737 361/705 |

FOREIGN PATENT DOCUMENTS

| | | |
|---|---|---|
| CN | 101133246 | 2/2008 |
| CN | 101454918 | 6/2009 |
| CN | 201255597 | 6/2009 |
| CN | 201273550 | 7/2009 |
| CN | 104661484 | 5/2015 |
| TW | 200530550 | 9/2005 |
| TW | M348267 | 1/2009 |
| TW | 201220033 | 5/2012 |
| TW | M500442 | 5/2015 |
| TW | M502875 | 6/2015 |

* cited by examiner

HEAT DISSIPATION MODULE AND ELECTRONIC DEVICE

CROSS-REFERENCE TO RELATED APPLICATION

This application claims the priority benefit of Taiwan application serial no. 105103327, filed on Feb. 2, 2016. The entirety of the above-mentioned patent application is hereby incorporated by reference herein and made a part of this specification.

BACKGROUND OF THE INVENTION

1. Field of the Invention

The invention relates to a heat dissipation module and an electronic device.

2. Description of Related Art

Recently, with the increasing development of hi-tech industry, electronic devices such as notebook computers, personal digital assistants and smart phones have been present in our daily lives frequently. Some electronic elements mounted in the electronic devices generate heat that affects operational efficiencies of the electronic devices. Therefore, heat dissipation modules or heat dissipations elements, such as heat dissipating fans, thermal pads or heat pipes, are often disposed in the electronic devices, so as to help dissipate the heat generated by the electronic devices out of the electronic devices.

Among the heat dissipation modules, heat dissipating fans may dissipate the heat outside effectively, but the heat dissipating fans consume much power, are heavier and occupy larger space, which are not preferable for application in electronic devices that pursue thin and light-weight designs. In addition, the heat dissipating fans make noise easily and affect the communication functions that the electronic devices provide. Furthermore, for the heat dissipating fans to dissipate heat via convection, casings of the electronics devices need to have openings, which also reduces mechanical strengths of the electronic devices.

On the other hand, the thermal pads may absorb the heat from the electronic devices to reduce surface temperatures thereof and require less cost and space, and therefore the thermal pads may be extensively applied in the electronic devices. However, it is difficult to dissipate the heat further to the outside via other members, and thus the heat dissipation effects of the thermal pads are limited.

Moreover, the heat pipes may transmit the heat from the electronic devices to another plate member. However, since convection is lacking, the heat dissipation effects are limited. Thereby, the heat pipes may form a loop in conjunction with an evaporator and a condenser, and a phase-change heat-transfer medium that changes between two phases (such as liquid phase and vapor phase) by means of heat absorbance or release may circulate and flow in the heat pipes to absorb heat in the evaporator and release heat in the condenser, so as to transmit the heat from the electronic devices to the outside. However, the heat-transfer medium merely flows in the loop by means of its own phase change, and the effect of its flow is less preferable. Therefore, the heat dissipating effect of the heat-transfer medium is limited.

SUMMARY OF THE INVENTION

The embodiments of the invention provide a heat dissipation module and an electronic device enhancing flowing efficiencies of a working fluid by means of a channel formed by magnetic powder in an evaporator.

The heat dissipation module is disposed in the electronic device, and the electronic device has a heat source. The heat dissipation module includes an evaporator, a pipe, a magnetic field generator and a plurality of magnetic powder. The heat source is heat conducting to the evaporator. The pipe connects to the evaporator to form a loop therewith, and a working fluid is filled in the loop. The magnetic field generator is disposed outside of the evaporator. The magnetic powder is movably disposed in the evaporator. A magnetic field generated by the magnetic field generator drives the magnetic powder to form a channel in the evaporator where the working fluid passes through. The heat generated by the heat source is transmitted to the evaporator, and the working fluid in liquid phase absorbs the heat and is phase-transited to vapor phase and flows from the evaporator towards the pipe.

The electronic device of the invention includes a first body, a second body, a heat source, an evaporator, a pipe, a magnetic field generator and a plurality of magnetic powder. The first body and the second body are pivotally connected and open/close with respect to each other. The evaporator is disposed at a position where the first body and the second body are pivotally connected, and the heat source is heat conducting to the evaporator. The pipe is connected to the evaporator to form a loop therewith, and a working fluid is filled in the loop. The magnetic field generator is disposed outside of the evaporator. The magnetic powder is movably disposed in the evaporator. A magnetic field generated by the magnetic field generator drives the magnetic powder to form a channel in the evaporator where the working fluid passes through. The heat generated by the heat source is transmitted to the evaporator, and the working fluid in liquid phase absorbs the heat and is phase-transited to vapor phase and flows from the evaporator towards the pipe.

In view of the above, in the heat dissipation module, by means of disposing the movable magnetic powder in the evaporator, the magnetic field generated by the magnetic field generator is able to affect the magnetic powder, so that the channel is formed in the evaporator. In addition, as the bodies of the electronic device exhibit different open/close states, the channel formed by the magnetic powder may have different profiles due to different magnetic fields. Thus, the working fluid has different driving modes by means of changes in the profiles of the channel. With such an arrangement, the electronic device dissipates heat from the heat source thereof by means of the heat dissipation module effectively in different operational states.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
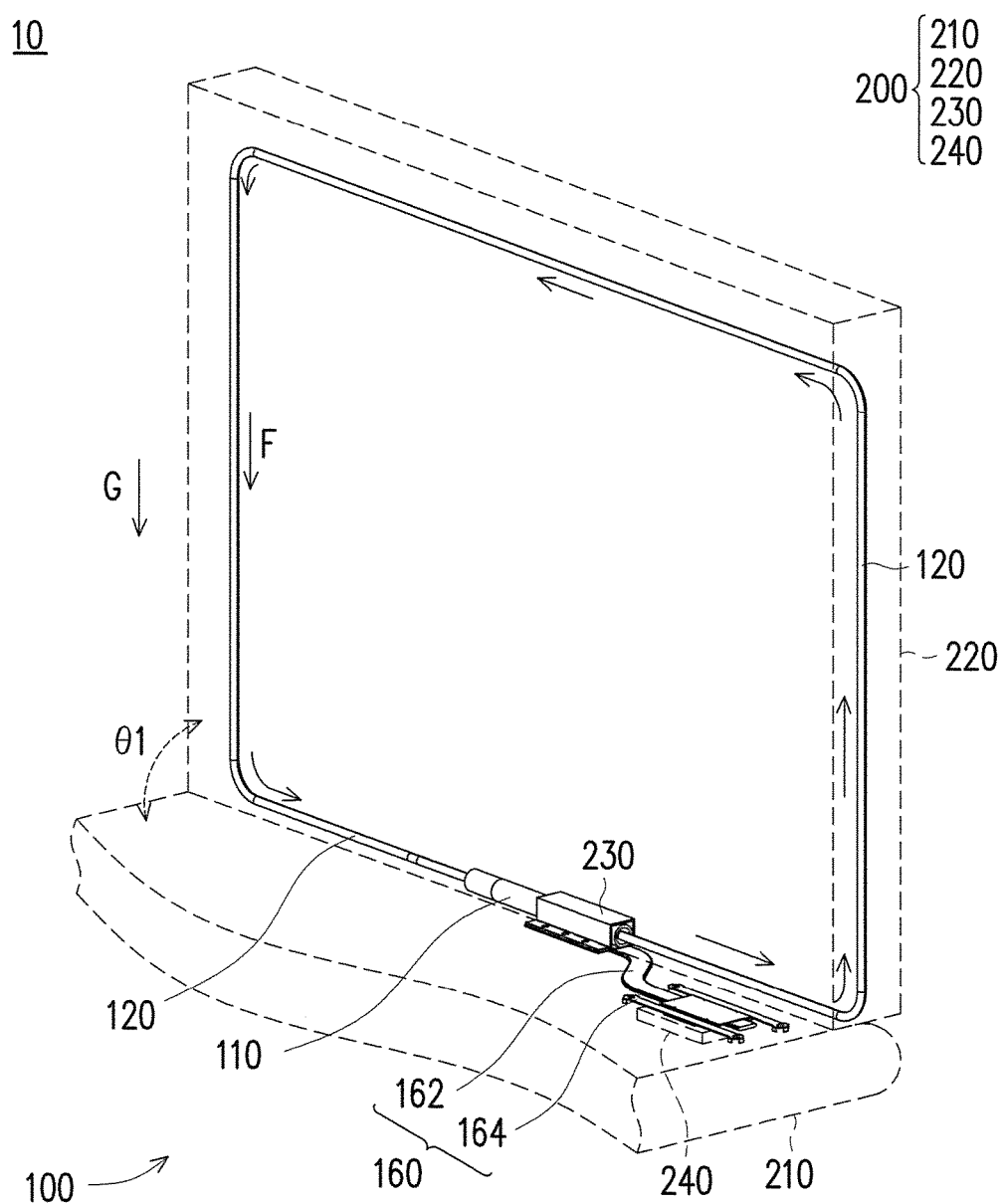
FIG. 1 is a partial schematic view of an electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
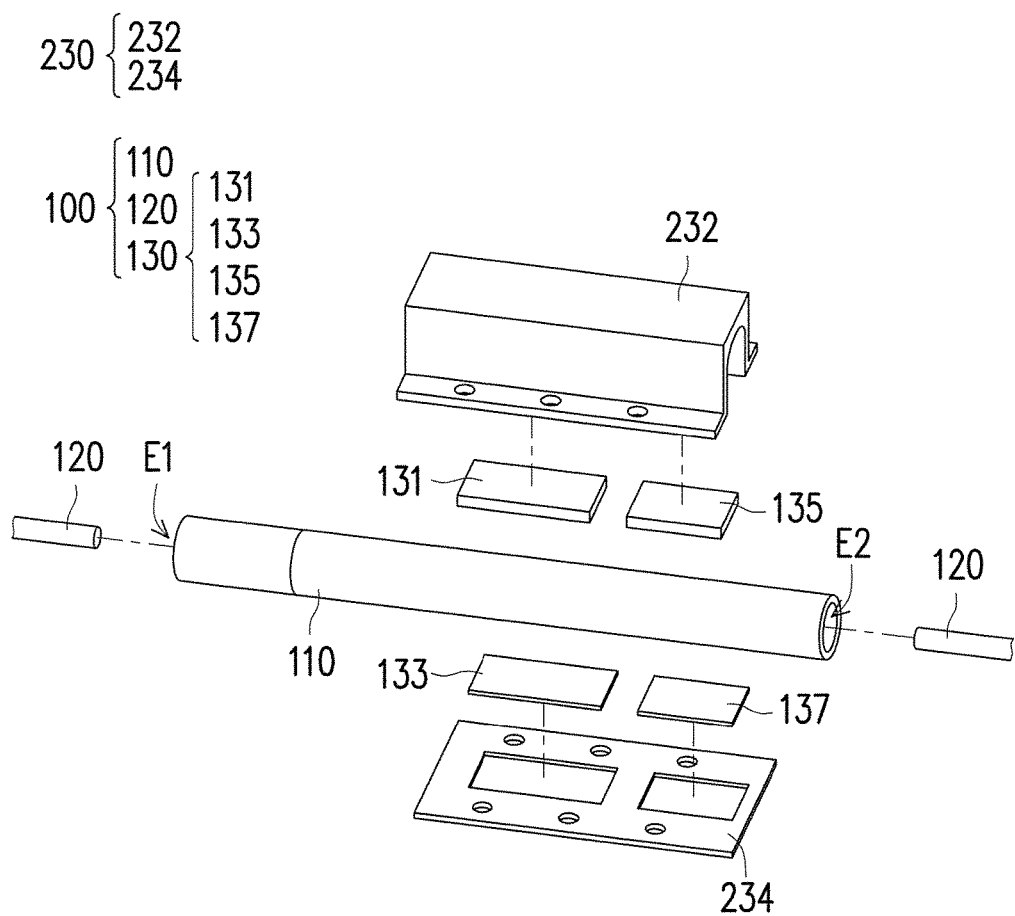
FIG. 2 is an exploded view of a portion of components in a heat dissipation module of the electronic device of FIG. 1.

FIG. 1 is a partial schematic view of an electronic device according to an embodiment of the invention. FIG. 2 is an exploded view of a portion of components in a heat dissipation module of the electronic device of FIG. 1. Referring to FIGS. 1 and 2, in this embodiment, an electronic device 10 is, for example, a notebook computer, but the invention is not limited thereto. The electronic device 10 includes a first body 210, a second body 220, a pivotal connection member 230, a heat source 240 and a heat dissipation module 100. The first body 210 is, for example, a main part of a notebook computer having a heat source 240 (such as a processor or a display chip in the main part), and the second body 220 is, for example, a display screen of the notebook computer pivotally connected to the first body 210 via the pivotal connection member 230, so that the first body 210 and the second body 220 may rotate and open/close with respect to each other.

The heat dissipation module 100 includes an evaporator 110, a pipe 120, a magnetic field generator 130 and a heat pipe assembly 160. The heat pipe assembly 160 includes a fastener 164 and a heat pipe 162, and one end of the heat pipe 162 contacts the heat source 240 while the other end of the heat pipe 162 contacts the evaporator 110, so that the heat generated by the heat source 240 is transmitted to the evaporator 110 via the heat pipe 162.

The evaporator 110 is disposed between members 232 and 234 of the pivotal connection member 230, and merely the members 232 and 234 are shown herein as an example. Detailed pivoting structure that facilitates rotating and opening/closing of the bodies has been available in the prior art and is thus not repeated herein. The pipe 120 connects an inlet E1 and an outlet E2 of the evaporator 110 to form a loop therewith, and a working fluid F is filled in the loop. Here, the working fluid F and its flow are represented merely by arrows beside or within the loop. The working fluid F in the loop undergoes phase change by means of heat absorbance or release, which enables the working fluid F to flow in the loop. When the heat is transmitted from the heat source 240 to the evaporator 110 via the heat pipe 162, the working fluid F in liquid phase in the evaporator 110 absorbs the heat and is converted into the working fluid F in vapor phase to flow toward the pipe 120 via the outlet E2. When the working fluid F in vapor phase flows through a portion of the pipe 120 at the second body 220, the working fluid F in vapor phase dissipates the heat by means of vast contact with other members or heat dissipation members in the second body 220, so that the portion of pipe 120 at the second body 220 may be deemed a condensing end of the heat dissipation module 100 for the working fluid F in vapor phase to dissipate heat and be condensed to the working fluid F in liquid phase and to flow back to the evaporator 110 again via the inlet E1. Herein, the portion of the pipe 120 at the second body 220 may be deemed to be disposed around the display screen.

As shown in FIG. 1, apart from the portion connected to the evaporator 110, the rest of the pipe 120 is all disposed at the second body 220. By disposing the heat source 240 and the pipe 120 respectively in different bodies, evaporating and condensing ends of the heat dissipation module 100 are away from and do not interfere with each other, so as to enhance heat dissipation efficiencies of the heat dissipation module 100.

Figure 3:
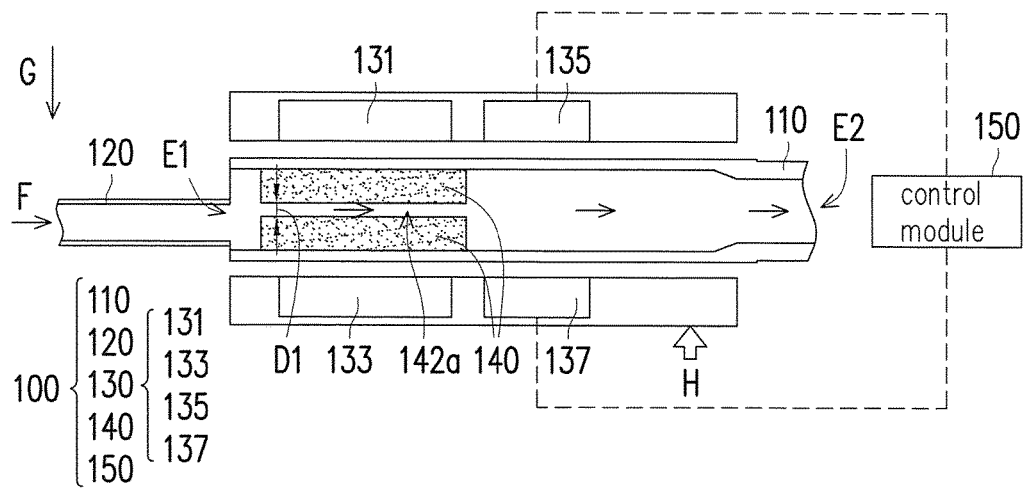
FIGS. 3 and 4 are respectively partial sectional views of an evaporator in the heat dissipation module.
Figure 4:
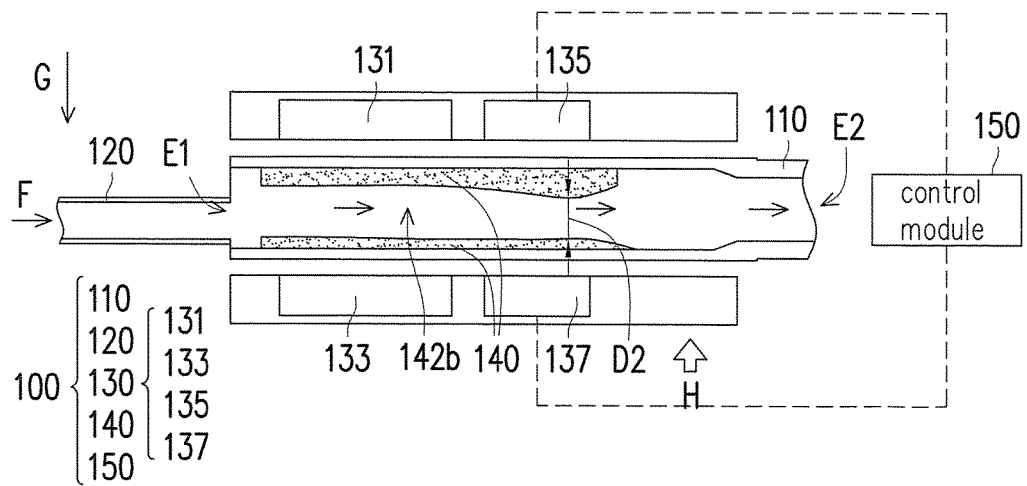

FIGS. 3 and 4 are respectively partial sectional views of an evaporator in the heat dissipation module. Referring to both FIGS. 3 and 4, the heat pipe 162 substantially contacts a heating point H of the evaporator 110, so that the heat in the heat source 240 is transmitted to the heating point H for heating the working fluid F therein. It is worth noting here that the heat dissipation module 100 further includes a plurality of magnetic powder 140. In this embodiment, the magnetic generator 130 is disposed outside the evaporator 110 and located in the members 232 and 234 of the pivotal connection member 230 (shown in FIG. 2), so as to provide at least one magnetic field at the pivotal connection member 230. The magnetic powder 140 is movably filled in the evaporator 110. Accordingly, the magnetic field provided by the magnetic field generator 130 is able to affect and drive the magnetic powder 140 in the evaporator 110, so as to change properties of a magnetic force of the magnetic field, such as the magnitude, distribution, density, and range, etc., thereof to change a distribution of the magnetic powder 140 in the evaporator 110. It should be noted herein that the subsequent drawings relating to the magnetic powder 140 in the evaporator 110 are only provided for a simple illustrative schematic purpose to describe the distribution of the magnetic powder 140 in the evaporator 110, and the contents and proportion of the magnetic powder 140 shall not be limited thereto.

Specifically, as shown in FIGS. 3 and 4, the magnetic field generator 130 includes first magnetic members 131 and 133 and second magnetic members 135 and 137. In addition, the first magnetic members 131 and 133 are disposed outside the evaporator 110 and adjacent to the inlet E1. The first magnetic members 131 and 133 are permanent magnets, for example, and provide a constant magnetic field, so as to limit the magnetic powder 140 in the evaporator 110. The second magnetic members 135 and 137 are disposed outside the evaporator 110 and adjacent to the outlet E2. The second magnetic members 135 and 137 provide a variable magnetic field to drive the magnetic powder 140 to change a position (or distribution) of the magnetic powder 140 in the evaporator 110. In this embodiment, the electronic device 10 further includes a control module 150. The second magnetic members 135 and 137 are electromagnets, for example, and are electrically connected to the control module 150 so as to change a magnetic field generated by the second magnetic members 135 and 137 under control of the control module 150. In other words, since the magnetic powder 140 is movable, a magnetic field generated by the first magnetic members 131 and 133 in the evaporator 110 needs to attach magnetic powder 140 to an inner wall of the evaporator 110, and then the second magnetic members 135 and 137 provide another magnetic field to drive the magnetic powder 140 to change the position of the magnetic powder 140 in the evaporator 110.

Thus, the magnetic powder 140 is affected by the magnetic field and attached to the inner wall of the evaporator 110 to form channels 142a and 142b. As variation of the magnetic field is controllable, the channels 142a and 142b may have different profiles as the magnetic field differs. Besides, the magnetic powder 140 is also stacked and accumulates, so as to form a capillary structure in the evaporator 110. The capillary structure formed by the magnetic powder 140 may effectively provide the working fluid F in liquid phase with a driving force to transmit the working fluid F to the heating point H of the evaporator via the pipe 120. Here, based on the requirements of the heat dissipation module, the designer may fill in magnetic powder with different particle diameters to change a capillary density of the capillary structure. Of course, the capillary density may also be changed by changing a magnetic force distribution in the magnetic field.

In addition, referring to FIG. 3, the heat dissipation module 100 shown in FIG. 3 substantially corresponds to a first state shown in FIG. 1, where the first body 210 and the second body 220 open with respect to each other. In addition, the second body 220 is disposed to stand on the first body 210, such that an opening angle θ1 is about 90 degrees. The state may be considered as a normal operation state of the notebook computer. Here, in a gravity direction G, the pipe 220 is substantially located above the evaporator 110. As the second body 220 opens at 90 degrees with respect to the first body 210, after the phase-transited of the working fluid F, the working fluid F actually circulates by utilizing gravity. Thus, how to direct the working fluid F to move in an expected direction (rightward direction in the figure) after the phase-transited (from liquid phase to vapor phase) needs to be further discussed. Accordingly, the control module 150 is used to drive a first magnetic field generated by the second magnetic members 135 and 137. Here, magnetic forces of the second magnetic members 135 and 137 are smaller than magnetic forces of the first magnetic members 131 and 133 (in an embodiment, the second magnetic members 135 and 137 may be turned off, namely no magnetic field is generated). Thus, the magnetic powder 140 accumulates at a position in the evaporator 110 corresponding to the first magnetic members 131 and 133, and the channel 142a having a first inner diameter D1 is formed. In addition, the first inner diameter D1 is smaller than an inner diameter of the inlet E1 and an inner diameter of the outlet E2. Such arrangement allows the working fluid F to generate a sufficient driving force between the evaporator 110 and the pipe 120 due to a greater pressure difference, so as to overcome the gravity and drive the working fluid F from an initial state (i.e., the working fluid F is driven from a still state to flow in the direction as indicated shown in the loop) and make the working fluid F move smoothly toward a predetermined direction after phase-transited.

Then, as shown in FIG. 4, when the working fluid F is driven to smoothly flow in the loop, the control module 150 may further drive the second magnetic members 135 and 137 to change the first magnetic field into a second magnetic field. Namely, the second magnetic members 135 and 137 provide a magnetic field to move a portion of the magnetic powder 140 from the position corresponding to the first magnetic members 131 and 133 to a position corresponding to the second magnetic members 135 and 137. Thus, stacking of the magnetic powder 140 is changed to form the channel 142b having a second inner diameter D2. In addition, the second diameter D2 is greater than the first diameter D1. Thus, with the channel 142b having the greater inner diameter D2, the working fluid F is able to flow more massively in the loop, so as to facilitate a flow speed of the working fluid F.

Figure 5:
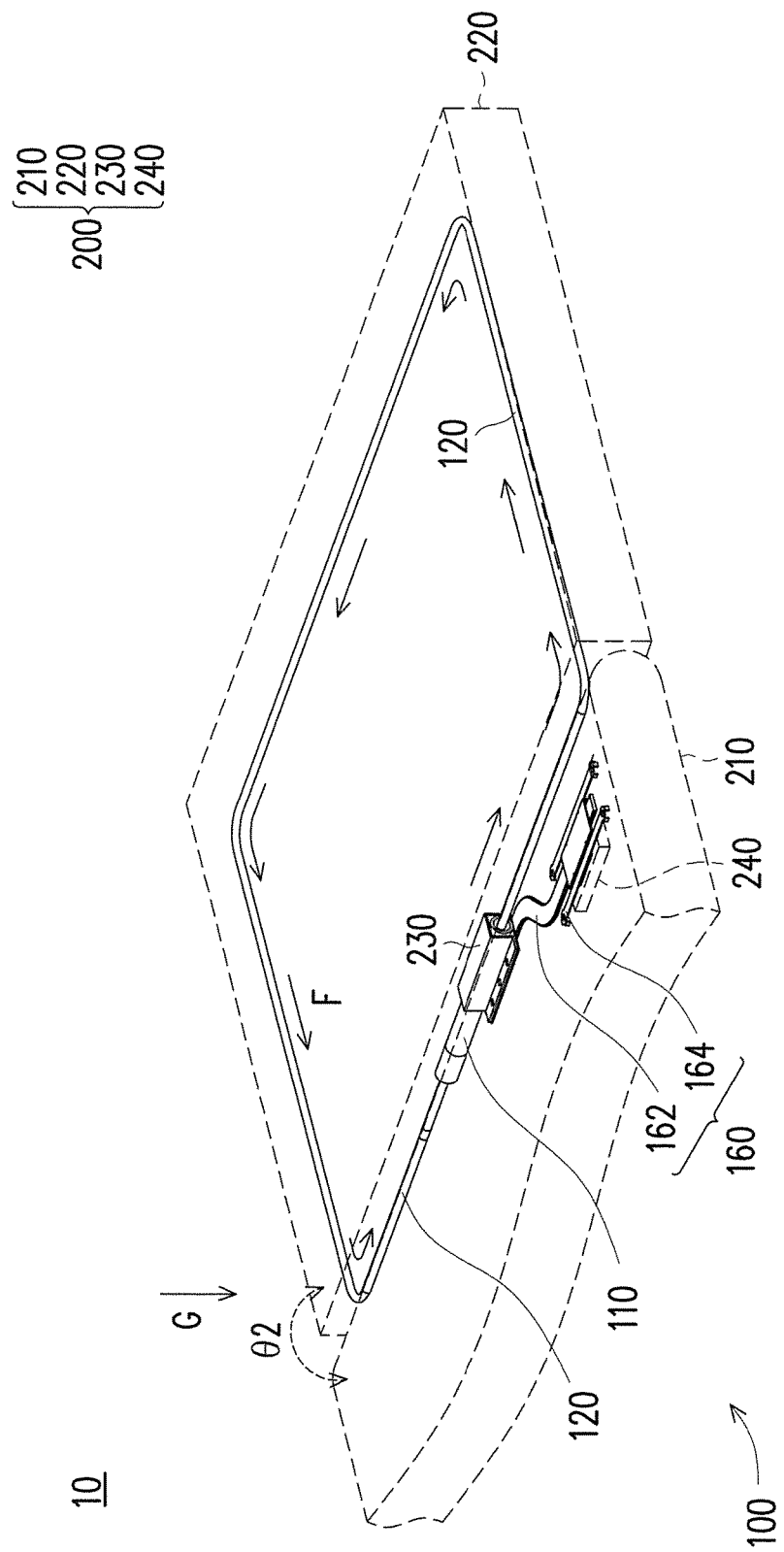
FIG. 5 is a schematic diagram of the electronic device of FIG. 1 in another state.
Figure 6:
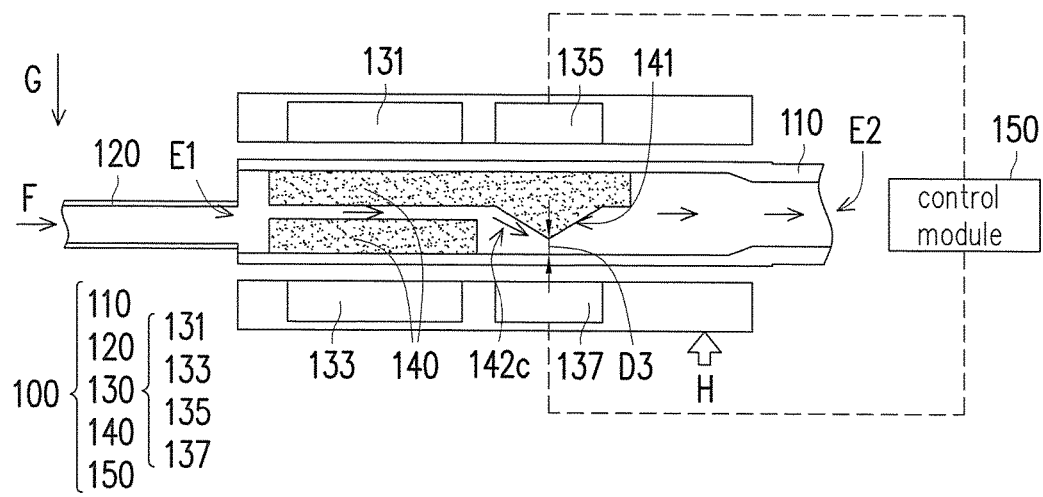
FIGS. 6 and 7 are respectively partial sectional views of the heat dissipation module in FIG. 5.
Figure 7:
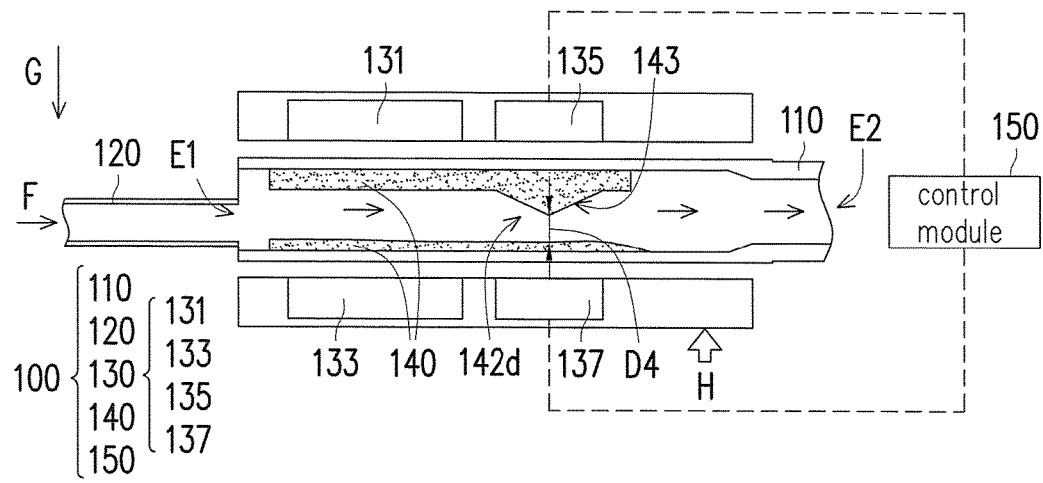

FIG. 5 is a schematic diagram of the electronic device of FIG. 1 in another state. FIGS. 6 and 7 are respectively partial sectional views of the heat dissipation module in FIG. 5. Referring to FIGS. 5 to 7, in this embodiment, the first body 210 and the second body 220 open with respect to each other, and the first body 210 and the second body 220 are in a second state where the first body 210 and the second body are nearly on the same plane (i.e., an opening angle θ2 between the first body 210 and the second body 180 are substantially 180 degrees, and the notebook computer in this state may be used as a tablet computer). Regarding the magnetic powder 140 in the second state, further to reducing the inner diameter of the channel to increase the pressure difference between the evaporator 110 and the pipe 120 for the working fluid F, another issue needs to be discussed is that, in the embodiments shown in FIGS. 3 and 4, since the pipe 120 is located above the evaporator 110 in the gravity direction G, the working fluid F in vapor phase is able to smoothly flow towards the pipe 120 due to its own properties (i.e., low density).

However, since the pipe 120 and the evaporator 110 of this embodiment are on the same plane, it is not as easy to utilize the properties of the working fluid F in vapor phase. Thus, the control module 150 of this embodiment further drives the second magnetic members 135 and 137 to generate a third magnetic field. In the third magnetic field, the magnetic force of the second magnetic member 135 is greater than the magnetic force of the second magnetic member 137, and the magnetic force of the second magnetic member 137 is close to zero. Thus, the magnetic powder 140 at the position of the second magnetic members 135 and 137 may form a barrier 141 in addition to forming a channel 142c, so as to block the working fluid F in vapor phase. Meanwhile, as the capillary structure formed by the magnetic powder 140 is filled with the working fluid F in liquid phase, the barrier 141 is substantially a structure combining the working fluid F in liquid phase and the magnetic powder 140, and a liquid wall generated by the barrier 141 is able to further block the working fluid F in vapor phase. In this way, the channel 142c formed by the magnetic powder 140 is able to drive the working fluid F to flow as well as prevent the working fluid F in vapor phase from flowing back.

Moreover, a state of the embodiment shown in FIG. 7 is similar to the embodiment shown in FIG. 4. Namely, after the working fluid F is driven successfully, the inner diameter of the channel may be further expanded to increase the flow rate. Here, the control module 150 drives the second magnetic members 135 and 137 to form a fourth magnetic field. In addition, the magnetic forces generated by the second magnetic members 135 and 137 are greater than zero and also greater than the magnetic forces generated by the first magnetic members 131 and 133, such that the magnetic powder 140 moves toward to the position corresponding to the second magnetic members 135 to 137 to make a fourth inner diameter D4 of an inner channel 142d greater than an inner diameter D3 shown in FIG. 6 and consequently increase the flow rate and flow speed of the working fluid in the channel 142d.

Based on above, the control module 150 is used to drive the second magnetic members 135 and 137 to generate different magnetic fields, so as to allow the magnetic powder 140 to form the channels 142a to 142d with different profiles in the evaporator 110, thereby adjusting flowing of the working fluid F in the evaporator 110. Moreover, as the open state of the first body 210 and the second body 220 differs, the control module 150 may correspondingly change the magnetic field of the second magnetic members 135 and 137 to allow the channels 142a to 142d or other possible configurations formed by the magnetic powder 140 to respectively correspond to the open state of the bodies, thereby allowing the working fluid F to flow in the loop in different ways to dissipate heat efficiently. In this embodiment, the control module 150 is able to sense and verify the open state of the bodies by using a sensor (not shown), so as to determine the properties of the magnetic field to be provided. However, the invention is not limited thereto.

Figure 8:
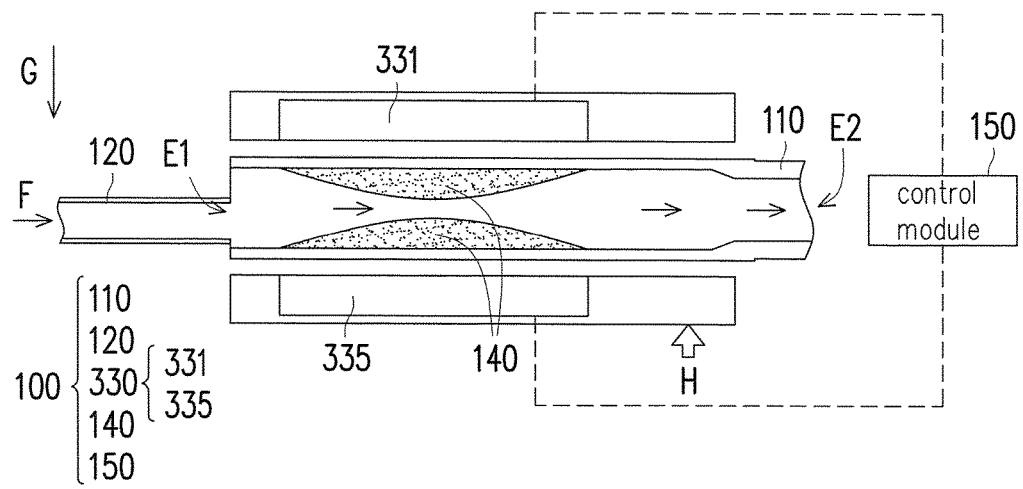
FIGS. 8 and 9 are respectively partial sectional views of the heat dissipation module in different embodiments of the invention.
Figure 9:
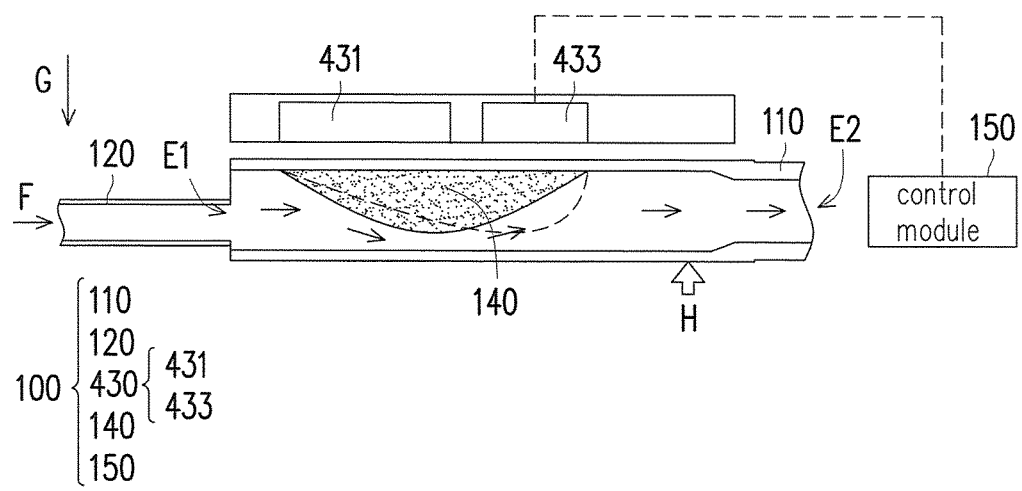

FIGS. 8 and 9 are respectively partial sectional views of the heat dissipation module in different embodiments of the invention. Referring to FIG. 8, it is shown that a magnetic field generator 330 includes second magnetic members 331 and 335 that are electromagnets. The second magnetic members 331 and 335 are electrically connected to the control module 150, so as to adjust properties of a magnetic field of the second magnetic members 331 and 335 by using the control module 150. The embodiment shown in FIG. 9 includes a first magnetic member 431 and a second magnetic member 433. The first magnetic member 431 is a permanent magnet, whereas the second magnetic member 433 is an electromagnet. The first magnetic member 431 and the second magnetic member 433 form a magnetic field generator 430 similarly providing different arrangements of the magnetic powder 140 in the evaporator 110, for example, strengthening a magnetic field generated by the second magnetic member 433, such that the magnetic powder gradually accumulates and forms a stack with a profile indicated by the broken line.

Figure 10:
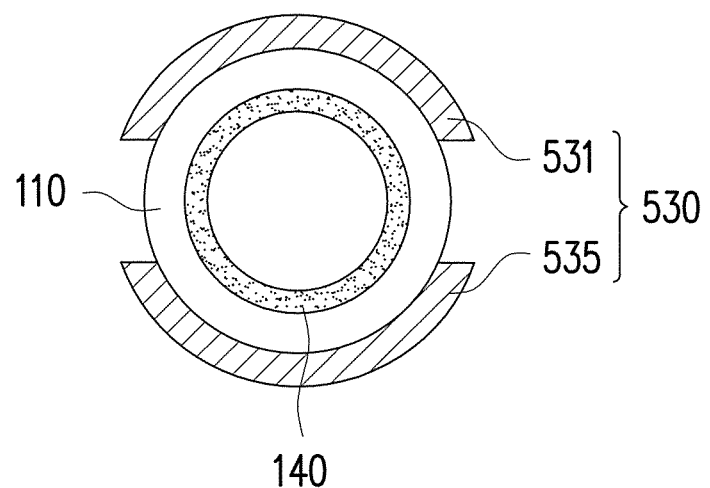
FIG. 10 is a sectional view of the evaporator of the heat dissipation module in another embodiment of the invention.

FIG. 10 is a sectional view of the evaporator of the heat dissipation module in another embodiment of the invention. What differs from the previous embodiment is that, a magnetic field generator 530 includes two arc-shaped magnetic members 531 and 535. One of the magnetic members 531 and 535 is a permanent magnet, and the other is an electromagnet, or the magnetic members 531 and 535 may both be electromagnets. The magnetic powder 140 inside may be distributed on the inner wall of the evaporator 110 evenly in correspondence with the arc-shaped magnetic members 531 and 535.

Based on the above, the embodiments of the invention provides various ways for the magnetic powder to exhibit variable profiles.

In view of the foregoing embodiments of the invention, the magnetic powder is provided inside the evaporator of the heat dissipation module, and the magnetic field generator is disposed outside the evaporator. Thus, the magnetic field generated accordingly may affect the magnetic powder, and the arrangement of the magnetic powder in the evaporator may change as the magnetic field differs, such that the magnetic powder may form the channel and capillary structure having different profiles, thereby changing flowing of the working fluid in the evaporator.

More specifically, according to the different states as to how the first body and the second body of the electronic device open with respect to each other, the control module may drive the magnetic field generator to generate different magnetic fields, such that the channel having different profiles may correspond to the open states of the bodies and the working fluid is thus able to smoothly flow in the loop to dissipate heat.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat dissipation module, disposed in an electronic device, the electronic device having a heat source, the heat dissipation module comprising:
an evaporator, heat conducting to the heat source, wherein the evaporator has an inlet and an outlet;
a pipe, connecting to the inlet and the outlet to form a loop therewith, wherein a working fluid is filled in the loop;
a magnetic field generator, disposed outside of the evaporator, wherein the magnetic field generator comprises:
at least one first magnetic member, disposed outside the evaporator and adjacent to the inlet; and
at least one second magnetic member, disposed outside the evaporator and adjacent to the outlet; and
a plurality of magnetic powder, movably disposed in the evaporator, wherein the first magnetic member provides a constant magnetic field to limit the magnetic powder in the evaporator, the second magnetic member provides a variable magnetic field to drive the magnetic powder to change a position of the magnetic powder in the evaporator, the constant magnetic field generated by the first magnetic member and the variable magnetic field generated by the second magnetic member drive the magnetic powder to form a channel in the evaporator where the working fluid passes through, heat generated by the heat source is transmitted to the evaporator, and the working fluid in liquid phase absorbs the heat and is phase-transited to vapor phase and flows towards the pipe.

2. The heat dissipation module according to claim 1, wherein the magnetic powder forms a capillary structure in the evaporator.

3. The heat dissipation module according to claim 1, wherein the second magnetic member generates the variable magnetic field to form the channel having a variable profile.

4. The heat dissipation module according to claim 3, wherein the magnetic field generator comprises an electromagnet.

5. The heat dissipation module according to claim 1, wherein the first magnetic member is a permanent magnet, and the second magnetic member is an electromagnet.

6. The heat dissipation module according to claim 1, wherein the first magnetic member and the second magnetic member are disposed with respect to the evaporator and along a gravity direction.

7. An electronic device, comprising:
a first body;
a second body, pivotally connected to the first body, so that the first body and the second body open and close with respect to each other;
a heat source;
an evaporator, disposed at a position where the first body and the second body are pivotally connected, wherein the heat source is heat conducting to the evaporator;
a pipe, connected to the evaporator to form a loop therewith, wherein a working fluid is filled in the loop;
a magnetic field generator, disposed outside the evaporator, wherein the magnetic field generator comprises an electromagnet;
a plurality of magnetic powder, movably disposed in the evaporator, wherein a magnetic field generated by the magnetic field generator drives the magnetic powder to form a channel in the evaporator where the working fluid passes through, the heat generated by the heat source is transmitted to the evaporator, and the working fluid in liquid phase absorbs the heat and is phase-transited to vapor phase and flows from the evaporator towards the pipe; and a control module, electrically connected to the electromagnet, wherein the control module adjusts a magnetic field generated by the electromagnet according to an open/close angle between the first body and the second body, so as to drive the magnetic powder to change its position in the evaporator to form the channel having a variable profile.

8. The electronic device according to claim 7, wherein the evaporator has an inlet and an outlet, the pipe connects the inlet and the outlet to form the loop, the control module drives the electromagnet to generate a first magnetic field when the first body and the second body open with respect to each other in a first state, so that the channel formed by the magnetic powder in the evaporator has a first inner diameter, and the first inner diameter is smaller than an inner diameter of the inlet and an inner diameter of the outlet so as to drive the working fluid to flow in the loop.

9. The electronic device according to claim 8, wherein after the first body and the second body are in the first state and the working fluid is driven to flow in the loop, the control module drives the electromagnet to generate a second magnetic field, so that the channel formed by the magnetic powder in the evaporator has a second inner diameter, and the second inner diameter is greater than the first inner diameter.

10. The electronic device according to claim 9, wherein the open/close angle between the first body and the second body is 90 degrees.

11. The electronic device according to claim 7, wherein the evaporator has an inlet and an outlet, the pipe connects the inlet and the outlet to form the loop, the control module drives the electromagnet to generate a third magnetic field when the first body and the second body open with respect to each other in a second state, so that the channel formed by the magnetic powder in the evaporator has a barrier and a third inner diameter, the third inner diameter is smaller than the inner diameter of the inlet and the inner diameter of the outlet so as to drive the working fluid to flow in the loop, and the barrier blocks the working fluid in vapor phase from flowing from the outlet to the inlet.

12. The electronic device according to claim 11, wherein after the first body and the second body are in the second state and the working fluid is driven to flow in the loop, the control module drives the electromagnet to generate a fourth magnetic field, so that the channel formed by the magnetic powder in the evaporator has a fourth inner diameter, and the fourth inner diameter is greater than the third inner diameter.

13. The electronic device according to claim 11, wherein the open/close angle between the first body and the second body is 180 degrees.

\* \* \* \* \*